(12) United States Patent
Whiting et al.

(10) Patent No.: US 9,874,611 B2
(45) Date of Patent: Jan. 23, 2018

(54) BATTERY CHARGER WITH AUTOMATIC VOLTAGE DETECTION

(71) Applicant: Schumacher Electric Corporation, Mt. Prospect, IL (US)

(72) Inventors: John Whiting, Hampshire, IL (US); Matthew A. Heins, Arlington Heights, IL (US)

(73) Assignee: Schumacher Electric Corporation, Mt. Prospect, IL (US)

( * ) Notice: Subject to any disclaimer, the term of this patent is extended or adjusted under 35 U.S.C. 154(b) by 0 days.

(21) Appl. No.: 15/352,217

(22) Filed: Nov. 15, 2016

(65) Prior Publication Data

US 2017/0059659 A1 Mar. 2, 2017

Related U.S. Application Data

(63) Continuation of application No. 14/539,561, filed on Nov. 12, 2014, now Pat. No. 9,529,052, which is a continuation of application No. 14/032,374, filed on Sep. 20, 2013, now Pat. No. 8,922,172, which is a continuation of application No. 12/504,223, filed on Jul. 16, 2009, now Pat. No. 8,575,899.

(51) Int. Cl.
*H02J 7/04* (2006.01)
*G01R 31/36* (2006.01)
*H01M 10/44* (2006.01)
*H02J 7/00* (2006.01)

(52) U.S. Cl.
CPC ......... *G01R 31/362* (2013.01); *H01M 10/44* (2013.01); *H02J 7/0008* (2013.01); *H02J 7/0052* (2013.01); *H02J 7/0047* (2013.01)

(58) Field of Classification Search
CPC .................. G01R 31/362; G01R 31/3648
USPC .................. 320/162, 107, 149; 324/426
See application file for complete search history.

(56) References Cited

U.S. PATENT DOCUMENTS 4,847,546 A 7/1989 Bobier et al.
4,956,597 A 9/1990 Heavey et al.
(Continued)

OTHER PUBLICATIONS

International Search Report, PCT/US2010/041144, dated Sep. 1, 2010.

(Continued)

*Primary Examiner* — M'Baye Diao
(74) *Attorney, Agent, or Firm* — Michael Stanley Tomsa; McAndrews, Held & Malloy, Ltd.

(57) ABSTRACT

A battery charger is disclosed that is configured to be connected to an external battery by way of external battery cables. In accordance with an important aspect of the invention, the battery charger is configured with automatic voltage detection which automatically determines the nominal voltage of the battery connected to its battery charger terminals and charges the battery as a function of the detected nominal voltage irrespective of the nominal voltage selected by a user. Various safeguards are built into the battery charger to avoid overcharging a battery. For battery chargers with user-selectable nominal battery voltage charging modes, battery charger is configured to over-ride a user-selected battery voltage mode if it detects that the battery connected to the battery charger terminals is different than the user-selected charging mode.

25 Claims, 7 Drawing Sheets

(56) References Cited

U.S. PATENT DOCUMENTS

| | | |
|---|---|---|
| 5,233,230 A | 8/1993 | Bonar |
| 5,729,115 A | 3/1998 | Wakefield |
| 5,808,443 A | 9/1998 | Lundstrom |
| 6,268,665 B1 | 7/2001 | Bobry |
| 6,327,663 B2 | 12/2001 | Isaac et al. |
| 6,377,029 B1 | 4/2002 | Krieger |
| 6,384,575 B1 | 5/2002 | Chen et al. |
| 6,586,913 B2 | 7/2003 | Rolfes |
| 6,625,477 B1 | 9/2003 | Wakefield |
| 6,696,819 B2 | 2/2004 | Bertness |
| D494,925 S † | 8/2004 | Krieger |
| 6,822,425 B2 * | 11/2004 | Krieger ............... H02J 7/0054 320/137 |
| 6,963,186 B2 | 11/2005 | Hobbs |
| 7,047,072 B2 * | 5/2006 | Walker ............... A61B 5/053 607/5 |
| 7,149,067 B2 | 12/2006 | Falkner et al. |
| 7,235,977 B2 | 6/2007 | Koran et al. |
| 7,258,579 B2 | 8/2007 | Nam |
| 7,323,847 B2 | 1/2008 | Meyer et al. |
| 7,411,371 B2 | 8/2008 | Hobbs |
| 7,468,596 B2 | 12/2008 | Shum |
| 7,498,767 B2 | 3/2009 | Brown et al. |
| 7,528,734 B2 | 5/2009 | Kuo |
| 7,592,773 B2 | 9/2009 | Pellenc |
| D610,982 S † | 3/2010 | Shum |
| 8,018,198 B2 | 9/2011 | Meyer et al. |
| 8,054,047 B2 * | 11/2011 | Chen ............... H02J 7/0006 320/107 |
| 8,552,690 B2 | 10/2013 | Garrastacho et al. |
| 2002/0008523 A1 | 1/2002 | Klang |
| 2003/0128036 A1 | 7/2003 | Henningson et al. |
| 2004/0130298 A1 | 7/2004 | Krieger et al. |
| 2005/0088144 A1 | 4/2005 | Pacholok |
| 2006/0006838 A1 | 1/2006 | Clarke |
| 2006/0028178 A1 | 2/2006 | Hobbs |
| 2007/0247105 A1 | 10/2007 | Krieger et al. |
| 2009/0030476 A1 | 1/2009 | Hargrove |
| 2009/0265042 A1 * | 10/2009 | Mollenkopf ............... H02J 3/12 700/298 |
| 2010/0225466 A1 | 9/2010 | Liu et al. |
| 2011/0012561 A1 | 1/2011 | Whiting et al. |

OTHER PUBLICATIONS

Extended European Search Report for Application No. 10800331.0, dated Mar. 17, 2015.

Extended European Search Report for Application No. 15000370.5, dated Feb. 19, 2016.

Infinity 6-Bank Universal Battery Charger, believed publisher Neve's Uniforms & Equipment; publication year 2007.

Power Supplies TD 365; publisher Rutherford Controls International Corp., publication year 2005.

p. 10 of Vector Products 2006 Catalog, published in 2006 Catalog Page for VEC1 099A Battery Charger.

Infinity—6-Bank Universal Battery Charger, believed publisher Neve's Uniforms & Equipment; publication year 2007.†

Power Supplies—TD 365; publisher Rutherford Controls International Corp., publication year 2005.†

Generator Start Control Module; publisher Atkinson Electronics, Inc. publication date, at least as early as Apr. 25, 2005—Data Sheet and Operation and Installation Instructions—pp. 1-15.†

Instruction Manual for Vehicle and Golf Cart Battery Charger, model No. GBCPRO, was published in 2010 by Baccus Global.† p. 10 of Vector Products 2006 Catalog, published in 2006 Catalog Page for VEC1099A Battery Charger.†

User Manual for Vector Product's Smart Battery Charger—published in 2006.† pp. 1-6 of Report on Battery Chargers, Automatic Type dated Apr. 24, 2006, prepared by Underwriters Laboratories, published in 2006.†

\* cited by examiner

† cited by third party

BATTERY CHARGER WITH AUTOMATIC VOLTAGE DETECTION

CROSS REFERENCE TO RELATED APPLICATIONS

This application is a continuation of commonly owned U.S. patent application Ser. No. 14/539,561, filed on Nov. 12, 2014, which is a continuation of U.S. patent application Ser. No. 14/032,374, filed on Sep. 20, 2013 (now U.S. Pat. No. 8,922,172, issued Dec. 30, 2014), which is a continuation of U.S. patent application Ser. No. 12/504,223, filed on Jul. 16, 2009 (now U.S. Pat. No. 8,575,899, issued on Nov. 5, 2013), each of which are hereby incorporated by reference.

TECHNICAL FIELD OF THE INVENTION

The present invention relates to a battery charger configured to be connected to an external battery by way of external battery cables and more particularly to a battery charger with automatic voltage detection which automatically determines the nominal voltage of the battery connected to its battery charger terminals and charges the battery as a function of the detected nominal voltage irrespective of the nominal voltage selected by a user.

BACKGROUND

Various battery chargers for charging different types of batteries are known in the art. Examples of such battery chargers are disclosed in U.S. Pat. Nos. 5,729,115; 6,384,575; 6,625,477; and 7,468,596. Such a battery charger is also disclosed in U.S. Patent Application Publication No. US 2007/0247105 A1, all hereby incorporated by reference.

Since each different type of battery needs to be charged according to a specific charging algorithm for the specific battery, it is necessary for the battery charger to be properly configured for the battery type and nominal voltage of the battery connected to its battery charger terminals. Some known battery chargers require the user to determine the battery type and nominal voltage of a battery connected to its battery charger terminals. Such battery chargers require the user to manually configure the battery charger. Other known battery chargers automatically determine the battery type and the nominal voltage of the battery connected to its battery charger terminals and automatically configure the battery charger.

Various techniques are known for battery chargers for automatically determining the nominal voltage of the battery connected to the battery charger. For example, U.S. Pat. No. 6,384,575; and U.S. Pat. Pub. No. US 2007/0247105 A1 disclose battery chargers which distinguish different types of batteries by size. In general, these battery chargers include multiple charging pockets. The pockets are configured to receive different size batteries with different nominal voltages. These chargers merely need to sense which pocket has a battery connected to it in order to determine the battery voltage. However, such a technique is not applicable to battery chargers that are configured to be connected to external batteries by way of external battery cables.

U.S. Pat. No. 6,625,477 discloses a different technique for determining the nominal voltage of a battery connected to its battery charger terminals. The battery charger disclosed in the '477 patent is configured to identify the nominal voltage of specially configured batteries which include an identification contact. The battery charger includes a plurality of tap voltages juxtaposed so that when the battery is received in the battery charger, the identification contact on the battery will be connected to a tap voltage depending on its size and thus nominal voltage. Again, such a technique is not applicable to battery chargers that are configured to be connected to external batteries by way of external battery cables.

U.S. Pat. No. 5,729,115 discloses yet another technique for determining the nominal voltage of a battery connected to its battery charger terminals. In this technique, the battery charger includes a sensing contact in addition to the positive and negative battery terminals. The sensing contact is juxtaposed adjacent to the positive battery charger terminal. Whenever a battery is inserted into the battery charger, the sensing contact is configured so that it will be in contact with the positive battery terminal for a first type of battery and will not be in contact with the positive battery terminal for a second type of battery. The battery charger senses the voltage at the sensing contact and makes a determination of the nominal voltage of the battery connected to its positive and negative terminals based on the voltage at the sensing contact. This technique, like the techniques discussed above, is not applicable to battery chargers that are configured to be connected to external batteries by way of external battery cables.

Thus, there is a need for a battery charger that is configured to be connected to an external battery by way of external cables that can automatically determine the nominal voltage of the battery connected to its battery charger terminals.

SUMMARY

Briefly, the present invention relates to battery charger configured to be connected to an external battery by way of external battery cables. In accordance with an important aspect of the invention, the battery charger is configured with automatic voltage detection which automatically determines the nominal voltage of the battery connected to its battery charger terminals and charges the battery as a function of the detected nominal voltage irrespective of the nominal voltage selected by a user. Various safeguards are built into the battery charger to avoid overcharging a battery. For battery chargers with user-selectable nominal battery voltage charging modes, the battery charger is configured to over-ride a user-selected battery voltage mode if it detects that the battery connected to the battery charger terminals is different than the user-selected charging mode.

DESCRIPTION OF THE DRAWINGS

These and other advantages of the present invention will be readily understood with reference to the following specification and attached drawing wherein.

DETAILED DESCRIPTION

The present invention relates to a battery charger that is configured to be connected to an external battery by way of external cables, such as battery cables. In accordance with an important aspect of the invention, the battery charger is configured with automatic voltage detection which automatically determines the nominal voltage of the battery connected to its battery charger terminals and charges the battery as a function of the detected nominal voltage irrespective of the nominal voltage selected by a user. Various safeguards are built into the battery charger to avoid overcharging a battery. For battery chargers with user-selectable nominal battery voltage charging modes, the battery charger is configured to over-ride a user-selected battery voltage mode if it detects that the battery connected to the battery charger terminals is different than the user-selected charging mode.

Figure 1:
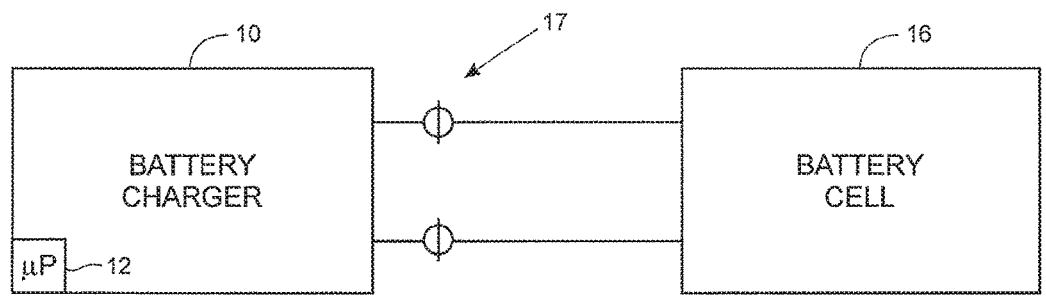
FIG. 1 is a block diagram of a battery charger that is configured to be connected to an external battery by way of external battery cables and determine the nominal voltage of a battery connected to its battery charger terminals.

The present invention can be implemented on virtually any battery charger, for example, the battery charger, illustrated in FIG. 1 and identified with the reference numeral 10, disclosed in commonly owned co-pending US Patent Application Publication No. 2005/0088144 A1, hereby incorporated by reference. The battery charger 10 includes a microprocessor/microcontroller 12 and a pair of battery charger terminals, generally identified with the reference numeral 17. Moreover, the principles of the present invention are applicable to any battery types, such as lead acid, absorbed glass mat (AGM), spiral wound AGM valve regulated lead acid (VRLA), flooded cell and deep-cycle batteries, generally identified by the reference numeral 16.

A battery charger is described and illustrated that is configured to detect whether a battery with a nominal 6 volts or 12 volts is connected to its terminals. However, the principles of the invention are applicable to detecting the nominal voltages of virtually any battery connected to the battery charger terminals. For example, the principles of the invention can be used to determine the nominal voltages of 8-, 24-, 36-, 48-, 60-volt batteries as well as the nominal voltage of virtually any battery. More particularly, the battery charger in accordance with the present invention is able to determine the nominal voltage of an external battery connected to its battery charger terminals by taking certain voltage measurements under certain conditions. For batteries having nominal voltages other than 6 volts/12 volts, the voltage levels set forth in FIGS. 2-7 are scalable. For example, for batteries with nominal voltages other than 6 volts/12 volts, the voltage levels illustrated in FIGS. 2-7 may be scaled in accordance with the ratio of the nominal voltages to the 6 volt/12 volt voltage levels illustrated in FIGS. 2-7.

As used herein, the battery voltage measurement refers to the open circuit battery voltage. In other words, the voltage across the battery charger terminals with no current flowing from the battery charger through the battery charger terminals. The principles of the present invention are also applicable to closed circuit battery voltage measurements in which the battery voltage measurements are made while an electrical current is flowing from the battery charger and through the battery terminals and thus includes the so-called "IR" drop across the battery cables and battery terminals.

Figure 2:
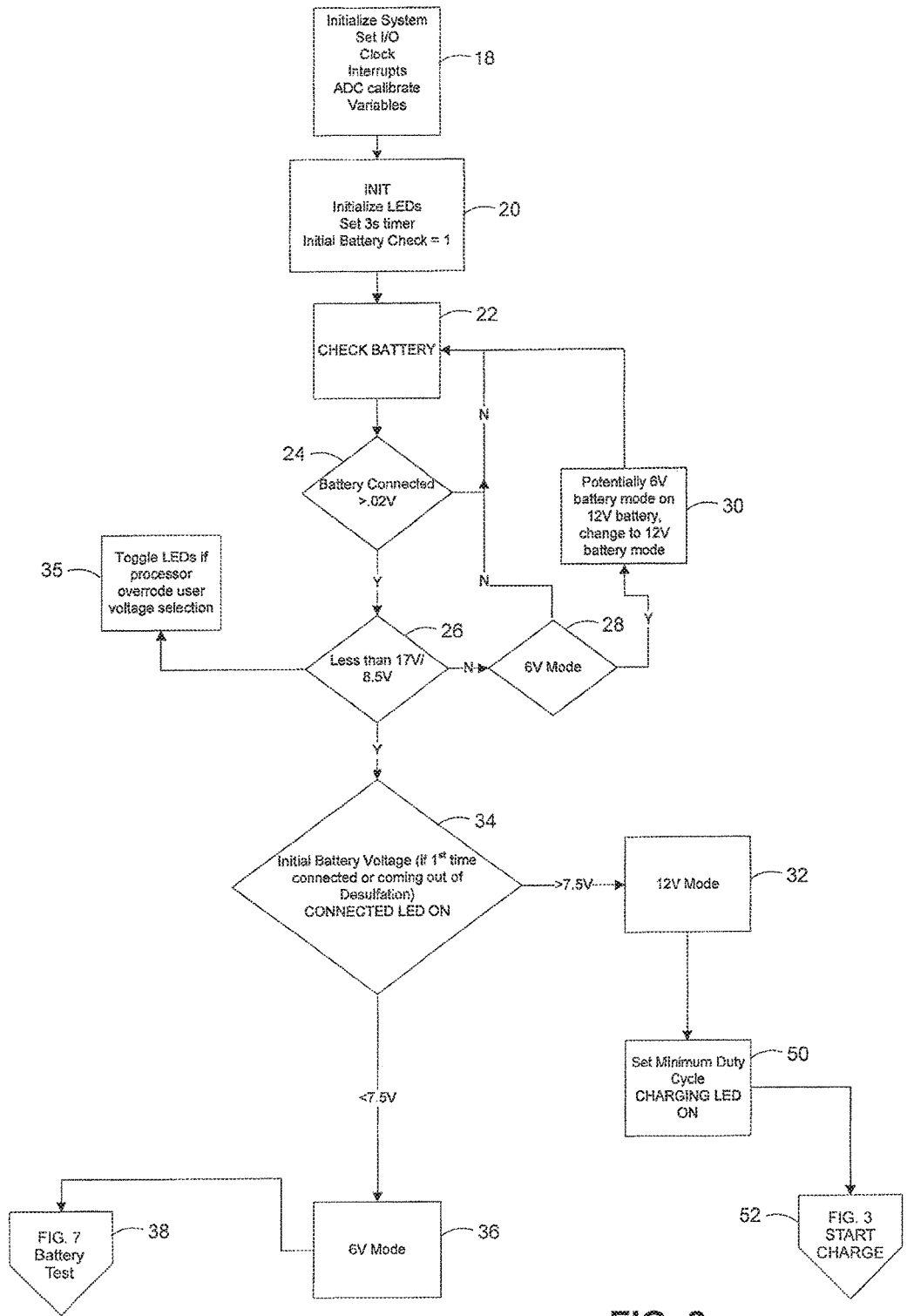
FIGS. 2-7 are software flow diagrams for the battery charger illustrated in FIG. 1 for detecting the nominal voltage of the battery connected to the battery charger terminals of the battery charger.

Turning to FIG. 2, on power-up, the battery charger 10 initializes the system, as indicated by logic blocks 18 and 20. More specifically, the input/output (I/O) ports on the microprocessor 12 are initialized along with the system clock. The analog to digital converters, which may be external or on board with the microprocessor 12, are calibrated and all system variables are initialized. In addition all LEDs are tested and set to their initial state. The variable "Initial Battery Check" is set=1 and the various timers as discussed below are initialized.

After initialization, the system proceeds to step 22 and checks the voltage across its battery charger terminals 17. Specifically, the battery charger terminals 17 are coupled to the ADC. The analog battery voltage is converted to a digital value and compared with a predetermined value. In other words, the system "reads" the voltage across the battery charger terminals and determines whether the voltage across the battery charger terminals is greater than a nominal amount, for example, 0.2 volts DC, a value simply indicative of whether a battery is connected across the battery charger terminals. If there is no battery connected across the battery charger terminals, the system loops back to steps 22 and 24 and waits for a battery to be connected to the battery charger terminals.

Once the system detects that a battery is connected across the battery charger terminals 17, the system initially makes a simple voltage measurement in order to determine whether the battery connected to its battery charger terminals has a nominal 6 volts or a nominal 12 volts. More specifically, the system initially determines in step 24 whether the voltage across the battery charger terminals is greater than the nominal amount, illustrated in FIG. 2 as 0.2 volts DC. If so, the system assumes a battery of unknown nominal voltage is connected across its battery charger terminals.

For battery chargers equipped with user-selectable mode switches, the system determines the position of the mode switch in step 28. Such mode switches are used to initially select the charging algorithm to be delivered by the battery charger to the battery connected to its battery charger terminals 17. As described herein, the mode switch (not shown) is user selectable between 6 volts and 12 volts.

In step 26, the system measures the battery voltage and compares the measured voltage with the voltage designated by the position of the mode selector switch to determine if the user-selectable mode switch is set for the correct mode. If the mode switch is set at 12 volts, the system initially determines if the measured voltage is less than 17 volts DC or 8.5 volts DC if the mode switch is set in a 6 volt mode. If the measured voltage is greater than 17 volts DC, the system checks in step 28 whether the user-selectable mode switch was set for the 6-volt mode. If the measured voltage is greater than 8.5 volts DC the user-selectable mode switch set for the 6 volts DC mode, the system assumes that a 12-volt DC battery is connected to the battery charger terminal 17. In this case, the system over-rides the user-selected position for the mode switch and configures the system to charge the battery in accordance with the 12-volt algorithm, as set forth below, as indicated in step 30 and proceeds to step 32. In addition, the system optionally toggles one or more LEDs indicating the over-ride of the user-selected mode position in step 35. The system then loops back to the logic block 22 and repeats steps 24 and 26. This time, since the battery mode was automatically set for the 12-volt mode by the battery charger, the measured voltage will be less than 17 volts and the system will proceed to step 34.

Alternatively, if the position of the user-selected mode switch is set by the user to the 12-volt DC mode, the system checks in step 26 whether the voltage connected to its battery charger terminals 17 is less than 17 volts DC and greater than 7.5 volts DC. The system assumes a 12-volt battery is connected to the battery charger and proceeds to steps 34 and 32 and charges the battery according to the 12-volt battery charger algorithm.

For battery chargers not equipped with a user-selectable mode switch, steps 26, 28, 30, and 34 may be eliminated. In such a configuration, the system may be configured to proceed from step 24 directly to steps 34 and 32.

Figure 6:
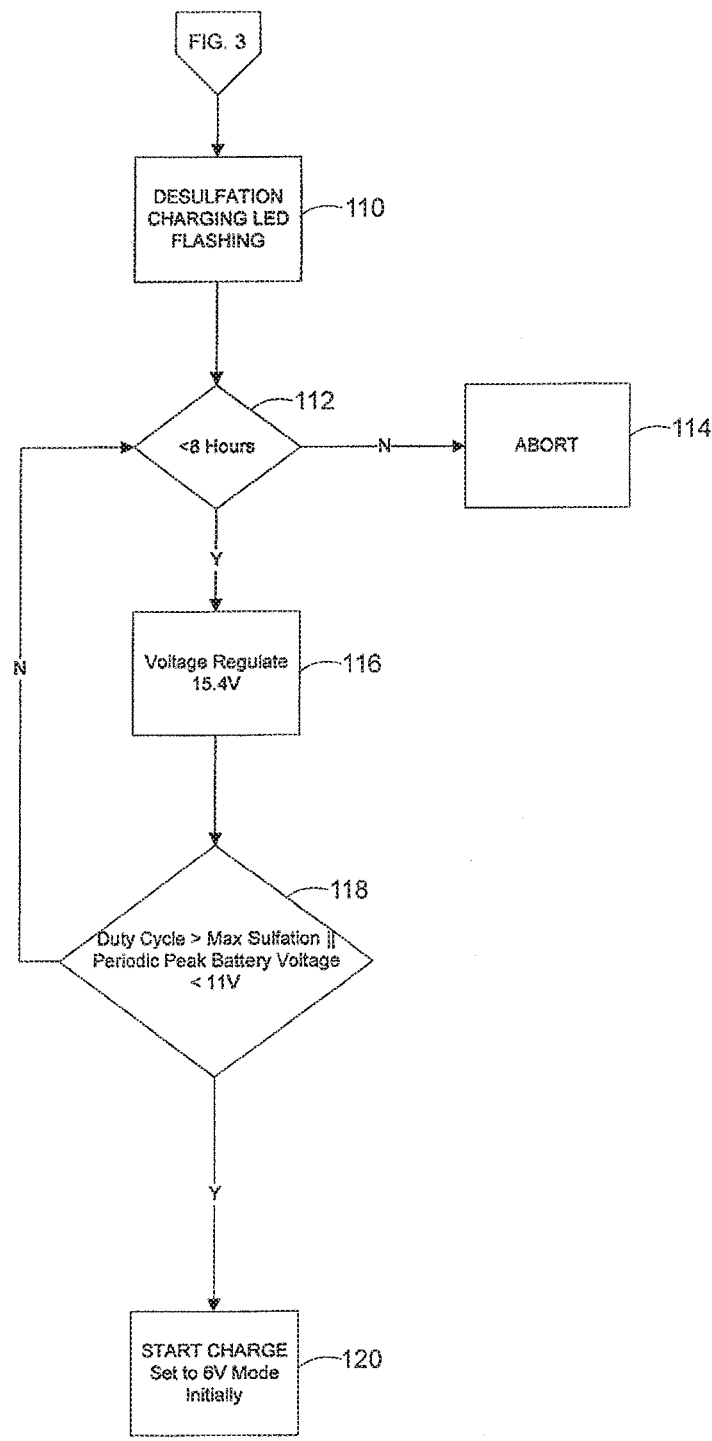

Once a battery is connected across the battery charger terminals 17, each time the voltage across the battery charger terminals 17 is measured, the variable "Initial Battery Voltage" is incremented. As indicated in step 20, the variable Initial Battery Voltage is initially set=1. For the first time the battery is connected across the battery charger terminals or the charge has completed a desulfation charge, as indicated in FIG. 6, the system may optionally turn on an LED in step 34 indicating that a battery is connected to its terminals. If the measured voltage in step 26 is greater than, for example, 7.5 volts DC, the system automatically assumes that the battery connected to its battery charger terminals is a 12-volt battery in step 32 and charges the battery according to a 12-volt charging algorithm, as will be discussed in detail below.

Alternatively, if the voltage measured in step 26 is less than, for example, 7.5 volts DC, the system must determine whether the battery connected to its battery charger terminals is a depleted 12-volt battery or a 6-volt DC battery. Accordingly, if the measured voltage is less than 7.5 volts DC, the system initially assumes that a 6-volt DC battery is attached to its battery charger terminals, as indicated in step 36. In order to differentiate between a depleted 12-volt battery and a 6-volt battery when the measured voltage across the battery charger terminals is less than 7.5 volts, a battery test is conducted, as indicated by the logic block 38.

Figure 7:
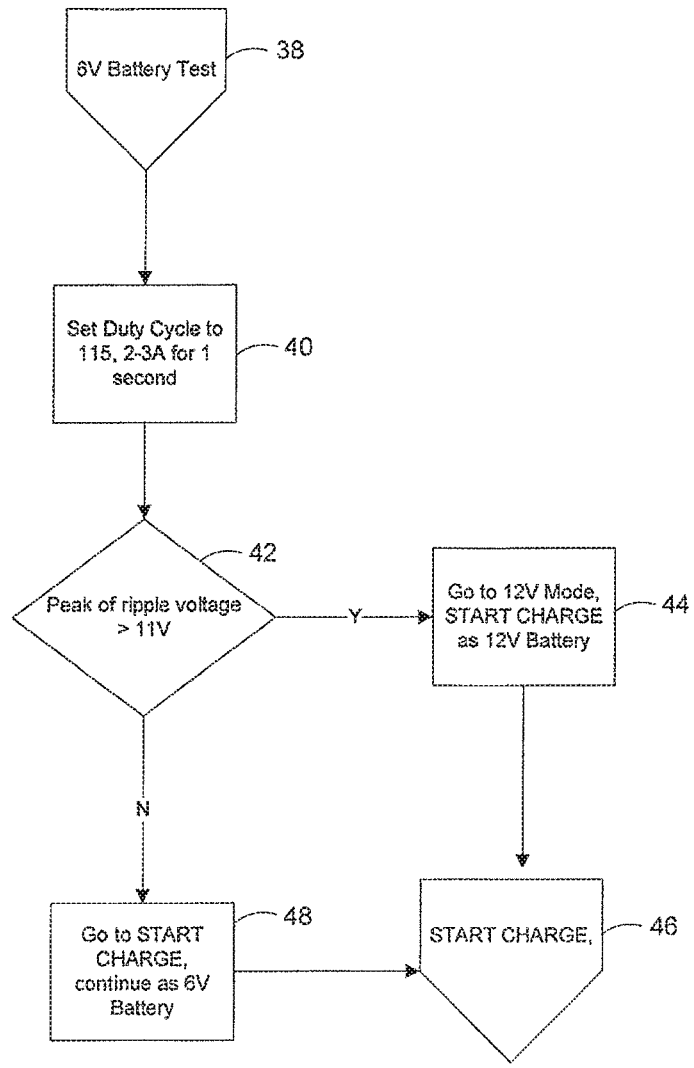

The test for determining whether the <7.5 volts measured in step 26 represents a 6 volt battery or a depleted 12-volt battery is illustrated in FIG. 7. In particular, the test consists forcing a test current, for example, 23 amperes DC, through the battery connected to its battery charger terminals for a short time, for example, 1 second, as indicated in step 40. The peak ripple voltage, i.e. closed circuit voltage, for example, across the battery 16 is measured in step 42. If the peak ripple voltage is greater than, for example, 11 volts DC, the system assumes the battery connected across the battery charger terminals is a depleted 12-volt battery. In this situation, the system proceeds to steps 44 and 46 and initiates charging of the battery in a 12-volt mode of operation. Alternatively, if the ripple voltage is less than 11 volts DC, the system proceeds to step 48 and initiates charging of the battery in a 6-volt mode of operation.

Figure 3:
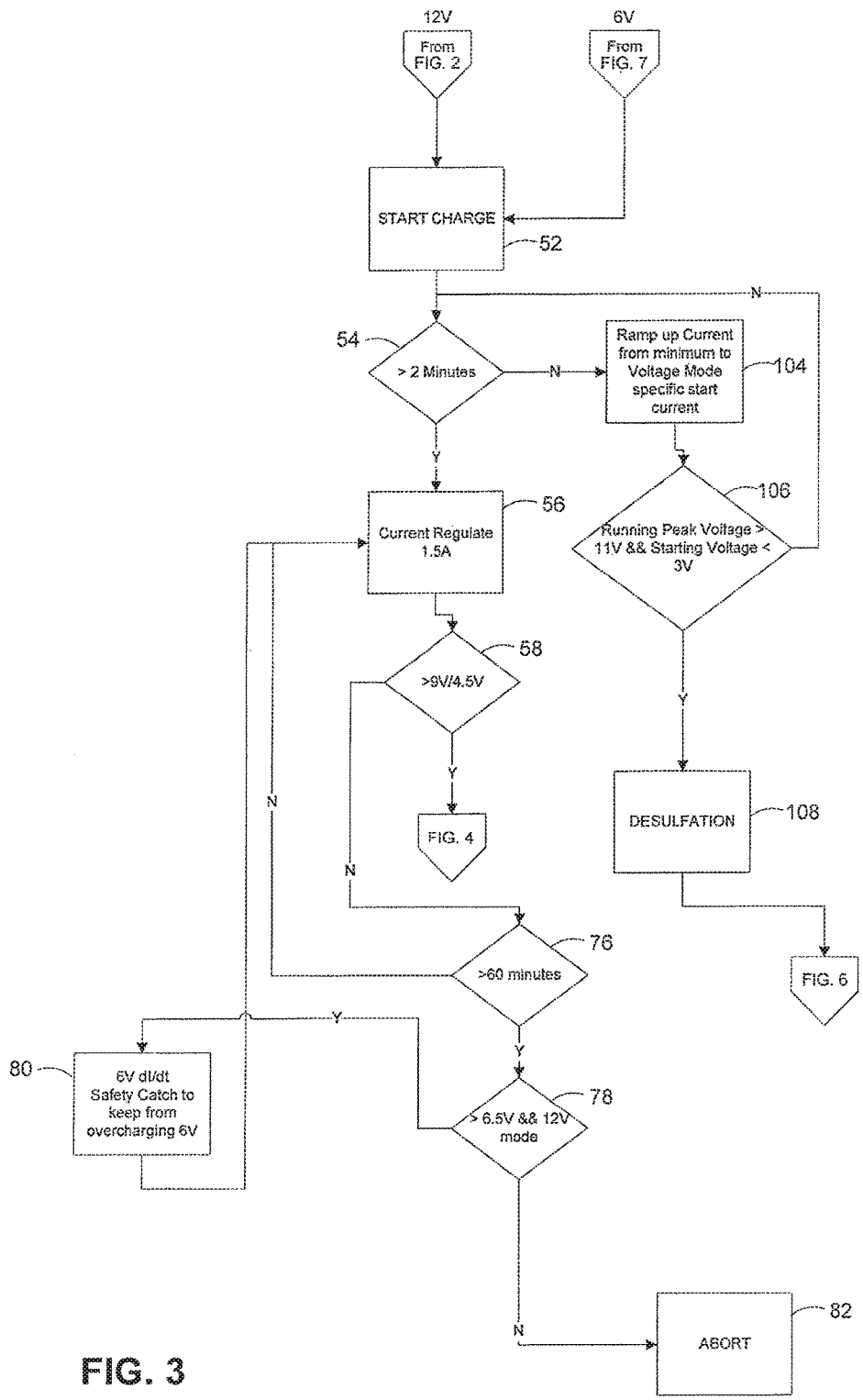
Figure 4:
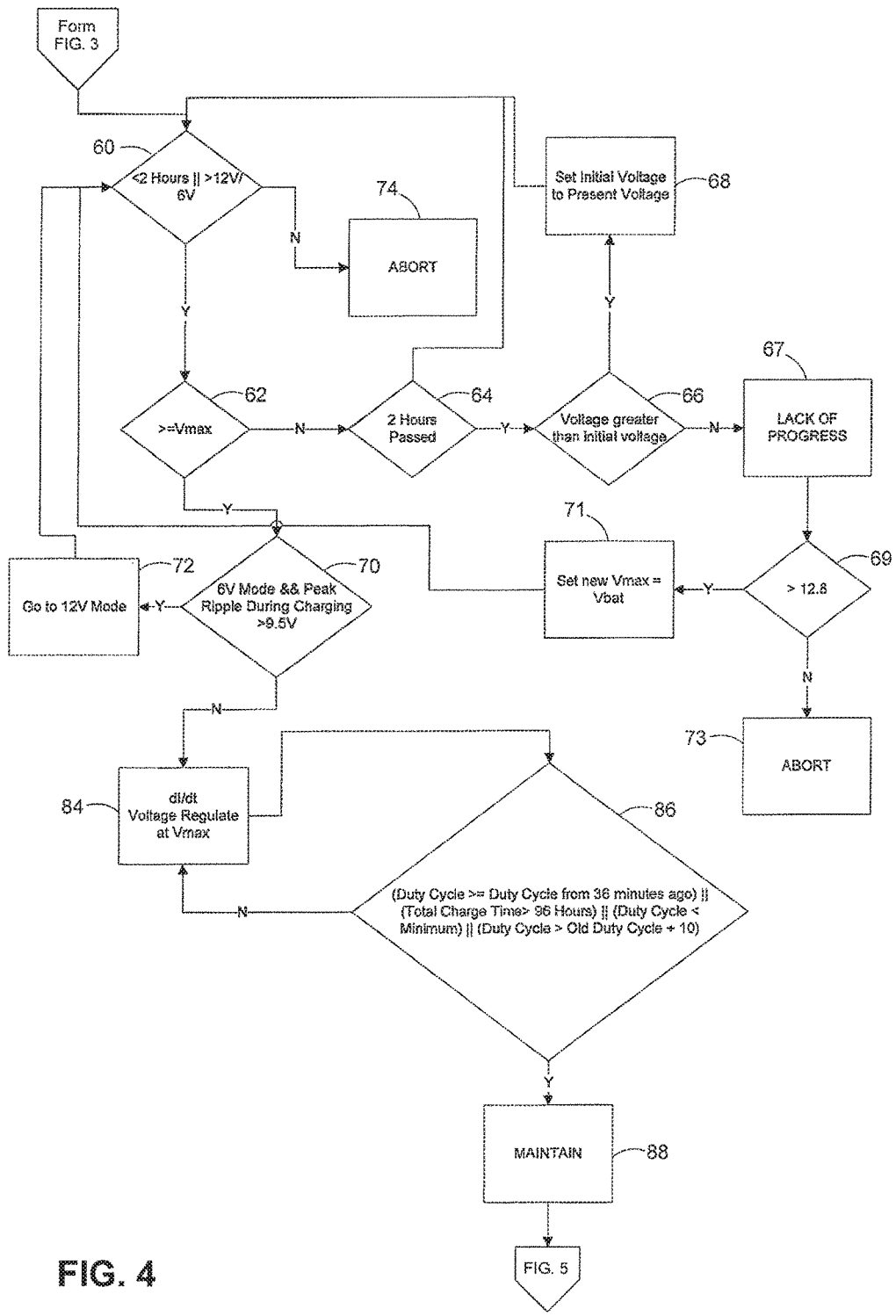
Figure 5:
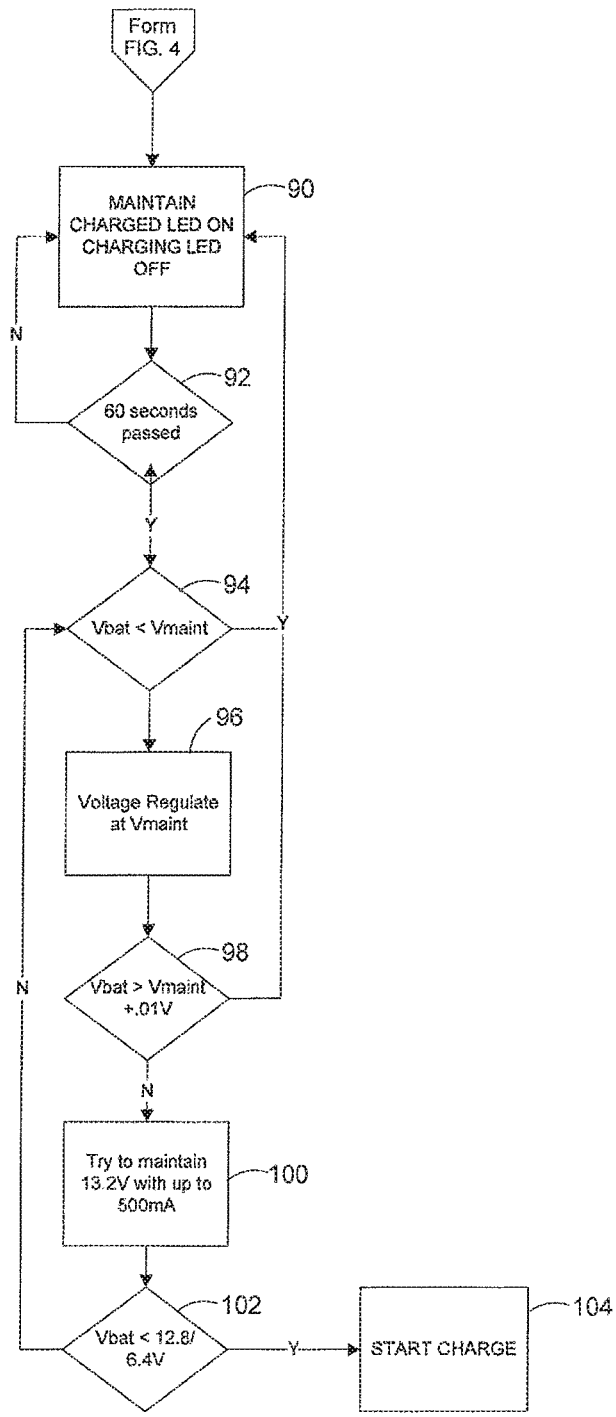

Once the voltage of the battery connected to the battery charger terminals is determined, the system operates in various charging modes. FIGS. 3 and 4 illustrate the 6-volt and 12-volt charging modes. FIG. 5 illustrates a maintenance charging mode. FIG. 6 illustrates a desulfation mode.

Referring first to FIGS. 3 and 4, even if the system determines that the battery connected across its terminals is a 12-volt DC battery, the system includes various safeguards in a 12-volt charging mode in the remote chance that the battery determined by the system to be a 12-volt battery is actually a 6-volt DC battery. In particular, in a 12-volt DC charging mode, the duty cycle of the charging current is set to a minimum, for example 25% in step 50 (FIG. 2). Optional Charging LEDs are also turned on. Once the duty cycle of the charging current is minimized, charging is started, as indicated by the logic block 52 (FIGS. 1 and 2). For the initial period of the charge in both a 12-volt DC charging mode and a 6-volt DC charging mode, for example, the first 2 minutes, as indicated in step 54, the system determines whether the battery connected to its battery charger terminals suffers from a condition commonly known as sulfation.

Sulfation is a condition associated with lead acid batteries. This condition occurs when a lead acid battery loses its ability to hold a charge after it is kept in a discharged state too long due to the crystallization of lead sulfate within the battery. The desulfation mode is discussed below.

In both a 6-volt charging mode and a 12-volt charging mode, after the first charging period, the charging current is limited, for example, to a nominal amount, for example, 1.5 amps DC, as indicated in step 56. The system repeatedly measures the voltage of the battery connected across its battery charger terminals 17. When the voltage exceeds 9 volts in a 12-volt charging mode, for example, as indicated by the logic block 58, the system assumes that the battery connected to its battery charger terminals is a 12-volt battery and proceeds with a normal 12-volt charge with safeguards as discussed herein. In a 6-volt charging mode, if the battery voltage exceeds 4.5 volts, the system proceeds with a normal 6-volt charge.

In both the 6-volt mode and the 12-volt mode, the battery is charged until the timeout period runs, for example, 2 hours, or the battery voltage exceeds 12 volts DC in a 12-volt mode or exceeds 6 volts in a 6-volt mode, as indicated by the logic block 60 (FIG. 3). The timeout period functions as a safety check to make sure that the battery voltage increases to at least 4.5/9.0 volts in a 6/12 volt-mode in for example, 2 hours.

During the charging period, the system continually checks whether the voltage of the battery connected to its battery charger terminals 17 is ≥Vmax, Vmax represents the previously measured highest voltage of the battery. The system repeatedly checks the voltage of the battery in step 62 and whether the 2 hour timer has timed out in step 64.

If the battery charger was initially configured for a 6-volt operating mode, and the battery voltage exceeds, for example 9.5 volts DC, as indicated in step 70, the system proceeds to step 72 and charges the battery in a 12-volt charging mode. During conditions in which the battery voltage is <9.5 volts and the system is configured in a 6-volt DC charging mode, as indicated by the logic block 70, the system assumes a 6-volt charging mode. During a 6-volt charging mode, the system regulates the battery voltage at Vmax, i.e. the previously measured highest DC voltage in step 84. The system also continues to regulate the rate of change of charging current, for example, at a constant current, i.e. dI/dt=0, for example 1.5 amps During a 6-volt charging mode, the duty cycle of charging current is repeatedly monitored, as indicated by the exemplary logic illustrated in block 86, where the symbol II represents a logical OR. In general, the voltage is held constant at Vmax by continuously reducing the current by reducing the duty cycle. Once the current levels off and the voltage is maintained, the system assumes that the battery is fully charged. Once the battery is fully charged, the system enters a maintenance state, as indicated by the logic block 88.

If the battery voltage is less than 9 volts, for example, for the first 60 minutes of charging, as indicated by the logic blocks 58 and 76 (FIG. 3), the system determines whether the current battery voltage exceeds 6.5 volts in step 78. If the battery voltage exceeds, for example, 6.5 volts, a further safeguard is provided by the system to prevent accidental charging of a 6-volt battery during a 12-volt charging mode. In particular, the rate of change of the charging current dI/dt is limited, as indicated by the logic block 80. In particular the charging current is regulated at a constant value, for example, 1.5 amps, i.e. dI/dt=0.

In a 12-volt mode, if after 60 minutes, the voltage across the battery charger terminals is <6.5, as indicated by the logic block 78, the battery is assumed to be damaged and the charge is terminated, as indicated by the logic block 82.

Once the 2 hours have passed, the system checks in step 66 whether the current battery voltage is greater than the initial battery voltage. If so, the initial battery voltage is set to equal the current battery voltage in step 68 and system loops back to steps 62, 64, 66, and 68 until the battery voltage exceeds Vmax, as indicated by the logic block 62. In addition, after the 2-hours have passed, if the system determines that the current battery voltage is not greater than the initial battery voltage, the system assumes a lack of progress in step 67. During this condition, the battery voltage is measured. If the voltage is greater than, for example 12.8 volts DC, as determined in step 69, the system sets Vmax=the current battery voltage in step 71. The system loops back to step 60 and continues to charge. Alternatively, if the voltage measured in step 69 is less than 12.8 volts, the battery is assumed to be damaged and charging is terminated, as indicated in step 73.

The maintenance charge mode is illustrated in FIG. 5. Initially in steps 90 and 92, the charging LED is turned off and the maintenance charge LED for a predetermined time period, for example, 60 seconds. After the predetermined time period, the system checks whether the battery voltage Vbat<the maintenance charge voltage Vmaint, for example, 12.8 volts DC in a 12-volt charging mode and 6.4 volts DC in a 6-volt charging mode. If the battery voltage Vbat<the maintenance charge voltage Vmaint, the system and continuously loops back to step 90 and maintains the maintenance charge LEDs on until the battery is disconnected. Alternatively, if the voltage Vbat>the maintenance charge voltage Vmaint, the system is configured in order to regulate the battery voltage at the maintenance voltage Vmaint, as indicated in step 96. In other words, a maintenance charging current is pumped into the battery in order to regulate the battery voltage at the maintenance voltage Vmaint. Next, in step 98, the system checks whether the battery voltage Vbat has climbed above the maintenance voltage Vmaint, by a nominal amount, for example, 0.1 volts DC. If so, the system maintains the maintenance charge LEDs on and continues regulating the battery voltage at the maintenance charge voltage Vmaint. If the battery voltage Vbat is not greater than the maintenance voltage by a nominal amount, the system will attempt to maintain the battery at 13.2 volts DC in a 12-volt mode and 6.6 volts DC in a 6-volt mode with up to a nominal maintenance charging current, for example, up to 500 mAmps, as indicated in step 100. During a maintenance charge mode, the system repeatedly checks the battery voltage. If the battery voltage in a 12-volt mode drops below, for example, 12.8 volts in a 12 volt mode or 6.4 volts in a 6-volt mode, as indicated in step 102, the system initiates a full 12-volt or 6-volt charge in step 104. If the battery voltage is >12.8 volts in a 12-volt mode or >6.4 volts in a 6-volt mode, the system stays in a maintenance charge mode and repeats steps 94-102.

As mentioned previously, a sulfation condition is a condition of lead acid batteries that will not hold a charge due to the crystallization of lead sulfate. Desulfation is a process of repeatedly sending short current surges through the damaged battery. The current pulses tend to break down and dissolve the sulfate crystals, restoring some of the battery's capacity over time.

Turning first to FIG. 3, during the first portion of every charging cycle of lead acid batteries, the system checks for a sulfation condition. In particular, the system checks the initial voltage of the battery and then ramps up the charging current from a minimum to, for example 1 amp, in step 104 and checks the peak battery voltage in step 106. If the peak voltage is >11 volts, for example, but the initial voltage was less than 3 volts, for example, the system assumes a sulfation condition exists and initiates a desulfation charge as indicated by the logic block 108.

A 6-volt and 12-volt sulfated battery look about the same. In general, the charger 10 will try to maintain the battery voltage at around 15.4 volts with a current with a relatively low maximum. If the battery is salvageable, the current will hit the maximum and the voltage will begin to drift down. If it drifts down below, for example, 11 volts, then the battery is most likely a 6-volt battery. Rerunning the battery detection test mentioned above can be used to confirm the determination. More specifically, the desulfation charge mode is illustrated in FIG. 6. In a desulfation charge mode, desulfation LEDS are flashed in step 110. The desulfation charge is conducted for a set time period, 8 hours, for example, as indicated by the logic block 112. After the set time period, the desulfation charge is terminated, as indicated by the logic block 114. During the desulfation charging period, the battery voltage is regulated at, for example, 15.4 volts, as indicated by the logic block 116 by way of current pulses are applied to the battery. The current pulses are applied to the battery until the battery accepts charge.

During a desulfation mode, the battery charger is actually maintaining the peak ripple voltage at the high voltage. The actual battery voltage when the charger is off during this period is generally unreliable as an indicator of battery health from 0.1V on up. The system determines if the battery has been recovered and can accept charge if the battery begins to take current, i.e. the charging duty cycle has increased to a sufficient level or if the peak ripple has come down substantially below, for example 11 volts. Once the system determines that the battery has recovered by the battery is initially charged in a 6-volt mode, as indicated by the logic box 120. The nominal voltage of the battery is subsequently determined, as discussed above and the battery is charged as a function of its nominal voltage.

Obviously, many modifications and variations of the present invention are possible in light of the above teachings. Thus, it is to be understood that, within the scope of the appended claims, the invention may be practiced otherwise than as specifically described above.

What is claimed is:

1. A method of supplying current to a battery in a battery system having a processor to determine a nominal voltage of the battery, the method comprising:
measuring, via a sensor, a first voltage of the battery across a pair of battery cables;
comparing, via the processor, the first voltage to a first predetermined value to determine whether the nominal voltage of the battery is a first nominal voltage;
determining, via the processor, the nominal voltage of the battery to be the first nominal voltage if the first voltage is greater than the first predetermined value;
supplying, via the pair of battery cables, a test current to the battery if said first voltage is not greater than the first predetermined value;
measuring, via the sensor, a second voltage across the pair of battery cables in response to the test current;
comparing the second voltage to a second predetermined value to determine, via the processor, whether the nominal voltage of the battery is the first nominal voltage or a second nominal voltage, wherein the first nominal voltage is greater than the second nominal voltage; and supplying a charge current to the battery as a function of the first nominal voltage or the second nominal voltage as determined by the processor.

2. The method of claim 1, wherein the first nominal voltage is 12 volts DC and the second nominal voltage is 6 volts DC.

3. The method of claim 1, wherein the first nominal voltage is 24 volts DC and the second nominal voltage is 12 volts DC.

4. The method of claim 1, further including the step of determining whether the battery is connected to the pair of battery cables by measuring a third voltage across the pair of battery cables.

5. The method of claim 4, wherein the battery is determined to be connected to the pair of battery cables if the third voltage is greater than a third predetermined value.

6. The method of claim 5, wherein third predetermined value is at least 0.01 volts DC.

7. The method as recited in claim 1, wherein the test current is forced through the battery for a predetermined period of time.

8. The method as recited in claim 7, wherein the processor determines the nominal voltage of the battery to be the first nominal voltage if the second voltage is not less than the second predetermined value.

9. The method as recited in claim 8, wherein the processor determines the nominal voltage of the battery to be the second nominal voltage if the second voltage is less than the second predetermined value.

10. The method as recited in claim 9, wherein the second predetermined value is about 11 volts DC.

11. The method as recited in claim 10, wherein the second voltage is a peak ripple voltage.

12. The method as recited in claim 7, wherein the predetermined period of time is about 1 second.

13. A battery system to supply current to a battery via a pair of battery cables, the battery system comprising:
an automatic voltage detection system to determine a nominal voltage of the battery, wherein the automatic voltage detection system is configured to (1) measures a first voltage of the battery across the pair of battery cables, (2) compare, the first voltage to a first predetermined value to determine whether the nominal voltage of the battery is a first nominal voltage, (3) determine the nominal voltage of the battery to be the first nominal voltage if the first voltage is greater than the first predetermined value, (4) measure a second voltage across the pair of battery cables if said first voltage is not greater than the first predetermined value, and (5) compare the second voltage to a second predetermined value to determine whether the nominal voltage of the battery is the first nominal voltage or a second nominal voltage, wherein the first nominal voltage is greater than the second nominal voltage; and
a system to supply current to the battery as a function of the first nominal voltage or the second nominal voltage as determined by the automatic voltage detection system.

14. The battery system of claim 13, wherein the second voltage is measured in response to a test current supplied through said battery.

15. The battery system of claim 14, wherein the test current is forced through the battery for a predetermined period of time.

16. The battery system of claim 15, wherein the predetermined period of time is about 1 second.

17. The battery system of claim 14, wherein the automatic voltage detection system is configured to determine that the nominal voltage of the battery is (1) the first nominal voltage if the second voltage is greater than the second predetermined value and (2) the second nominal voltage if the second voltage is not greater than the second predetermined value.

18. The battery system of claim 16, wherein the first nominal voltage is 12 volts DC, the second nominal voltage is 6 volts DC, and the second predetermined value is about 11 volts DC.

19. The battery system of claim 18, wherein the second voltage is a peak ripple voltage.

20. A battery system to supply current to a battery via a pair of battery cables, the battery system comprising:
a sensor to measure a voltage of the battery across the pair of battery cables;
a processor operatively coupled with the sensor to determine a nominal voltage of the battery, wherein the processor is configured to (1) receive, via the sensor, a first voltage of the battery across the pair of battery cables, (2) compare the first voltage to a first predetermined value, wherein the processor is configured to determine that the nominal voltage of the battery is a first nominal voltage when the first voltage is greater than the first predetermined value, (3) receive, via the sensor, a second voltage across the pair of battery cables if said first voltage is not greater than the first predetermined value, wherein the second voltage is measured in response to a test current supplied through said battery, and (4) compare the second voltage to a second predetermined value to determine whether the nominal voltage of the battery is the first nominal voltage or a second nominal voltage, wherein the first nominal voltage is greater than the second nominal voltage; and
a charger circuit to supply a charging current to the battery as a function of the first nominal voltage or the second nominal voltage as determined by the processor.

21. The battery system of claim 20, wherein the test current is forced through the battery for a predetermined period of time.

22. The battery system of claim 21, wherein the predetermined period of time is about 1 second.

23. The battery system of claim 20, wherein the processor is configured to determine that the nominal voltage of the battery is (1) the first nominal voltage when the second voltage is greater than the second predetermined value and (2) the second nominal voltage when the second voltage is not greater than the second predetermined value.

24. The battery system of claim 23, wherein the first nominal voltage is 12 volts DC and the second nominal voltage is 6 volts DC.

25. The battery system of claim 23, wherein the second voltage is a peak ripple voltage.

* * * * *